United States Patent [19]

Shaw et al.

[11] Patent Number: 5,426,070
[45] Date of Patent: Jun. 20, 1995

[54] MICROSTRUCTURES AND HIGH TEMPERATURE ISOLATION PROCESS FOR FABRICATION THEREOF

[75] Inventors: Kevin A. Shaw; Z. Lisa Zhang; Noel C. MacDonald, all of Ithaca, N.Y.

[73] Assignee: Cornell Research Foundation, Inc., Ithaca, N.Y.

[21] Appl. No.: 67,089

[22] Filed: May 26, 1993

[51] Int. Cl.[6] .......................................... H01L 21/44
[52] U.S. Cl. .................................. 437/203; 437/228; 437/921; 437/919
[58] Field of Search ............... 437/901, 921, 203, 228, 437/919; 148/DIG. 159, DIG. 50

[56] References Cited

U.S. PATENT DOCUMENTS

| | | |
|---|---|---|
| 3,672,985 | 6/1972 | Nathanson et al. |
| 3,835,338 | 9/1974 | Martin . |
| 4,381,672 | 5/1983 | O'Connor et al. |
| 4,437,226 | 3/1984 | Soclof . |
| 4,522,682 | 4/1985 | Soclof . |
| 4,670,092 | 6/1987 | Motamedi . |
| 4,685,198 | 8/1987 | Kawakita et al. |
| 4,706,374 | 11/1987 | Murakami . |
| 4,740,410 | 4/1988 | Muller et al. |
| 4,746,621 | 5/1988 | Thomas et al. |
| 4,772,928 | 9/1988 | Dietrich et al. |
| 4,776,924 | 10/1988 | Delapierre . |
| 4,783,821 | 11/1988 | Muller et al. |
| 4,845,048 | 7/1989 | Tamaki et al. |
| 4,851,080 | 7/1989 | Howe et al. |
| 4,853,348 | 8/1989 | Tsubouchi et al. |
| 4,867,842 | 9/1989 | Bohrer et al. |
| 4,980,317 | 12/1990 | Koblinger et al. |
| 4,981,552 | 1/1991 | Mikkor . |
| 5,045,152 | 9/1991 | Sickafus . |
| 5,068,203 | 11/1991 | Logsdon et al. ............... 437/921 |
| 5,072,288 | 12/1991 | MacDonald et al. |
| 5,126,812 | 6/1992 | Greiff . |
| 5,149,673 | 9/1992 | MacDonald et al. |
| 5,156,988 | 10/1992 | Mori et al. .................... 437/228 |
| 5,179,499 | 1/1993 | MacDonald et al. |
| 5,198,390 | 3/1993 | MacDonald et al. ........... 437/203 |
| 5,235,187 | 8/1993 | Arney et al. |

FOREIGN PATENT DOCUMENTS

| | | | |
|---|---|---|---|
| 58-89859 | 5/1938 | Japan | 437/228 |
| 0089859 | 5/1983 | Japan . | |
| 62-232171 | 12/1987 | Japan . | |
| 63-136982 | 9/1988 | Japan . | |
| 294666 | 4/1990 | Japan | 437/921 |

OTHER PUBLICATIONS

Wilson et al., "Highly Selective, High Rate Tungsten Deposition", Materials Research Society, 1985, pp. 35–43.

Zhang et al., "An RIE Process for Submicron, Silicon Electromechanical Structures", IEEE, May 24, 1991, pp. 520–523.

Arney et al., "Formation of Submicron Silicon-on-Insulator Structures by Lateral Oxidation of Substrate Silicon Islands", J. Vac. Sci. Technol. B 6(1), Jan./Feb. 1988, pp. 341–345.

Zhang et al., "A RIE Process for Submicron, Silicon Electromechanical Structures", IOP Publishing Ltd., 1992, pp. 31–38.

(List continued on next page.)

Primary Examiner—Olik Chaudhuri
Assistant Examiner—S. Mulpuri
Attorney, Agent, or Firm—Jones, Tullar, & Cooper

[57] ABSTRACT

A method of fabricating released microelectromechanical and microoptomechanical structures having electrically isolating segments from single crystal silicon includes thermal oxidation steps. The structures are defined using a single mask patterning process, and the structure is partially thermally oxidized. This is followed by a second masking step which is used to define segments to be completely thermally oxidized, and a second oxidation step completes the fabrication of the isolating segment. Thereafter the structure is released from the underlying substrate.

11 Claims, 4 Drawing Sheets

OTHER PUBLICATIONS

"Fabrication of High Frequency Two-Dimensional Nanoactuators for Scanned Probe Devices", Yao et al. Journal of Microelectromechanical Systems, vol. 1, No. 1, Mar. 1992, p. 14–2.

"New SOI CMOS Process with Selective Oxidation" Kubota et al. IEDM 86, pp. 814–816.

"Nanostructures in Motion" Yao et al., Nanostructures and Mesoscopic Systems Wiley P. Kirk and Mark Reed, Eds. Academic Press, Dec. 1991; pp. 1–9.

Zhang and MacDonald; "An rie process for submicron, silicon electromechanical structures"; May 1991; pp. 520–523.

Lutze, Perera & Krusius; Anisotropic Reactive Ion Etching of Aluminum Using $Cl_2$, $BC_3$, and $CH_4$ Gases; Jan. 1990; J. Electrochem. Soc., vol. 137, No. 1.

Susanne C. Arney and Noel C. MacDonald; Formation of submicron silicon–on–insulator structures by lateral oxidation of substrate–silicon islands; Dec. 1987; pp. 341–345.

Mele, Arney, Krusius, and MacDonald; Anisotropic Reactive Ion Etching of $MoSi_2$ and In Situ Doped n+ and p+ Polysilicon Using $Cl_2$ and $BCl_3$; J. Electrochem. Soc., vol. 135, No. 9.; Sep. 1988; pp. 2373–2378.

Wolf, S., *Silicon Processing for the VLSI Era:vol. 2 Process Integration*, John Wiley & Sons, N.Y., 1990, pp. 54–6.

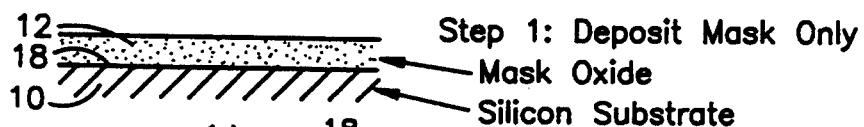

FIG.1A — Step 1: Deposit Mask Only / Mask Oxide / Silicon Substrate

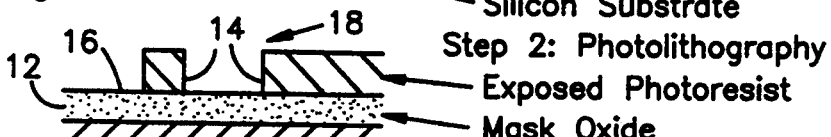

FIG.1B — Step 2: Photolithography / Exposed Photoresist / Mask Oxide / Silicon Substrate FIG.1C — Step 3: Transfer Pattern / Resist / Mask Oxide / Silicon Substrate

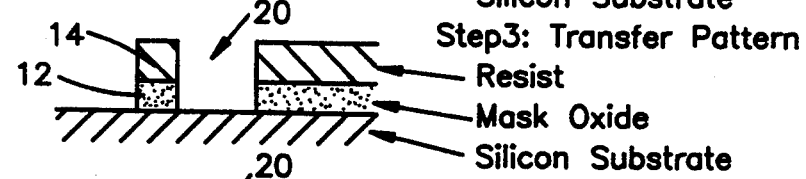

FIG.1D — Step 4: Strip Resist / Mask Oxide / Silicon Substrate

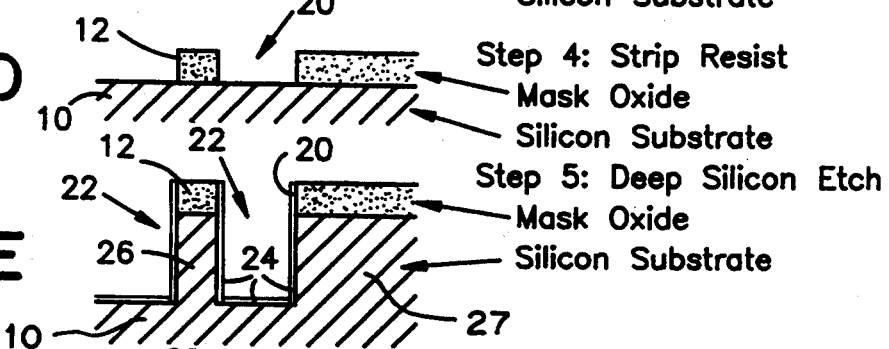

FIG.1E — Step 5: Deep Silicon Etch / Mask Oxide / Silicon Substrate

FIG.1F — Step 6: Deposit PECVD Oxide / Sidewall Oxide / Mask Oxide / Silicon Substrate

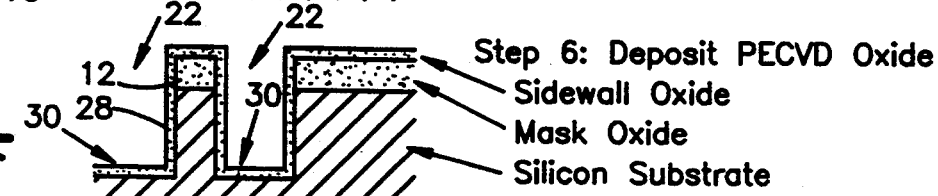

FIG.1G — Step 7: Vertical Oxide Etch / Mask Oxide / Silicon Substrate

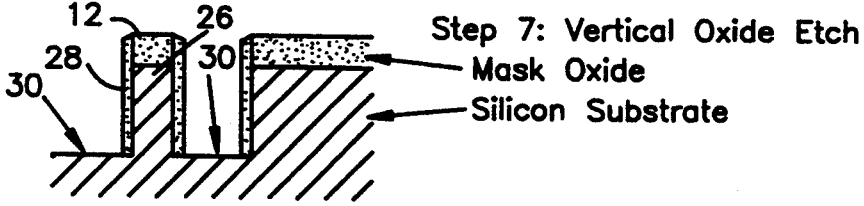

FIG.1H — Step 8: Silicon Etch #2 / Mask Oxide / Silicon Substrate

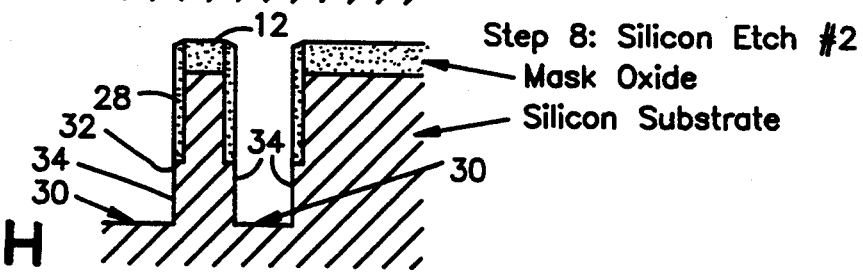

Step 5: Deep Silicon Etch
Mask Oxide
Silicon Substrate

MICROSTRUCTURES AND HIGH TEMPERATURE ISOLATION PROCESS FOR FABRICATION THEREOF

This invention was made with Government support under Grant No. DABT 63-92-C-0019, awarded by DARPA and Grant Nos. ECS 8805866 and ECS 8815775 awarded by the National Science Foundation. The Government has certain rights in the invention.

BACKGROUND OF THE INVENTION

This application relates to copending U.S. patent application Ser. No. 08/013,319, filed Feb. 5, 1993, which is hereby incorporated herein by reference.

This invention is directed, in general, to microstructures and to a process for fabricating them and more particularly, to microelectromechanical and microoptomechanical structures and to a thermal oxidation process for fabricating complete structures including released, movable elements and connectors such as pads, runners, electrodes, and the like on a substrate, and for electrically isolating such structures.

Recent developments in micromechanics have successfully led to the fabrication of microactuators utilizing processes which have involved either bulk or surface micromachining. The most popular surface micromachining process has used polysilicon as the structural layer in which the mechanical structures are formed. In a typical polysilicon process, a sacrificial layer is deposited on a silicon substrate prior to the deposition of the polysilicon layer. The mechanical structures are defined in the polysilicon, and then the sacrificial layer is etched partially or completely down to the silicon substrate to free the structures.

The initial research into surface micromachining established the viability of the technology. Moving rotors, gears, accelerometers, and other structures have been fashioned through the use of such a process to permit relative motion between the structures and the substrate. This process relies on chemical vapor deposition (CVD) to form the alternating layers of oxide and polysilicon and provides significant freedom in device design; however, CVD silicon is usually limited to layers no thicker than 1–2 $\mu$m, since residual stress in thicker layers overwhelms the structure and causes curling. Thus, although a large variety of layers can be combined to form very complicated structures, each layer is limited in thickness. In addition, the wet chemistry needed to remove the interleaved oxide layers often takes tens of hours of etching to remove, and once released the structures often reattach or stick to the substrate because of static electricity, and this requires elaborate process steps to overcome. The structures made of polysilicon inherently have a crystalline structure which has low breaking strength because of grain sizes, as well as electronic properties which are inferior to single crystal silicon. Furthermore although this technology is well established, it is not easily scaled for the formation of submicron, high aspect ratio mechanical structures.

In bulk micromachining, a silicon substrate is etched and sculpted to leave a structure. This has typically been done using wet chemical etchants such as EDP, KOH, and hydrozine to undercut single crystal silicon structures from a silicon wafer. However, such processes are dependent on the crystal orientation within the silicon substrate, since the chemistry etches as much as ten times faster in some crystallographic planes of silicon than in other planes. Although the shapes can be controlled to some degree by the use of photolithography and by heavy implantation of boron, which acts as an etch stop, it is difficult to control the process and accordingly, the type, shape and size of the structures that can be fabricated with the wet chemical etch techniques are severely limited. In particular, wet etch processes are not applicable to small (in the range of one micron or less) structure definition, because they are not controllable on that scale.

A dry bulk micromachining process which utilizes thermolateral oxidation to completely isolate 0.5 $\mu$m wide islands of single crystal silicon is described, for example, in the article entitled "Formation of Submicron Silicon-On-Insulator Structures by Lateral Oxidation of Substrate-Silicon Islands", *Journal of Vacuum Science Technology*, B 6(1), Jan./Feb. 1988, pp. 341–344, by S. C. Arney et al. This work led to the development of a reactive ion etching (RIE) process for the fabrication of submicron, single crystal silicon, movable mechanical structures wherein the oxidation-isolation step described in the Arney et al publication was replaced with an $SF_6$ isotropic release etch. This process, which allowed the release of wider structures, in the range of 1.0 $\mu$m, and deeper structures, in the range of 2–4 $\mu$m, is described in U.S. patent application Ser. No. 07/821,944, filed Jan. 16, 1992, now U.S. Pat. No. 5,198,390, assigned to the assignee of the present application. As there described, this dry etch process utilizes multiple masks to define structural elements and metal contacts and permitted definition of small, complex structures in single crystal silicon, and was easy to implement. However, the second lithography step was difficult to apply to deeper structures, particularly because of problems in aligning the second mask. Furthermore, that process relied upon the formation of a silicon dioxide layer on a single crystal silicon substrate, but since other materials such as GaAs or SiGe do not generate an oxide layer the way silicon does, the process could not be transferred to such other substrate materials.

In copending U.S. patent application Ser. No. 07/829,348, filed Feb. 3, 1992, now abandoned in favor of U.S. Ser. No. 08/171,965, filed Dec. 22, 1993, and assigned to the assignee of the present application, a process for releasing micromechanical structures in single crystal materials other than silicon is described. This process uses chemically assisted ion beam etching (CAIBE) and/or reactive ion beam etching (RIBE) to make vertical structures on a substrate, and uses reactive ion etching (RIE) to laterally undercut and release the structure. The process utilizes multiple masks, however, and thus encountered similar problems to the silicon process described above in the formation of deeper structures, and in the alignment of the second mask.

The use of single-crystal materials for mechanical structures can be beneficial, since these materials have fewer defects, no grain boundaries and therefore scale to submicron dimensions while retaining their structural and mechanical properties. In addition, the use of single-crystal materials, particularly single crystal silicon and gallium arsenide, to produce mechanical sensors and actuators can facilitate and optimize electronic and photonic system integration. For example, single crystal silicon structures having a very small mass can resonate without failure at 5 MHz for 2 billion cycles with a vibrational amplitude of plus or minus 200 nm. Accordingly, the fabrication of submicron mechanical structures with high aspect ratios would be highly desirable.

In copending application Ser. No. 08/013,319 a single-mask, low temperature (less than about 300°), self-aligned process for the fabrication of microelectromechanical (MEM) structures is described, the process allowing the fabrication of discrete MEM devices as well as the integration of such structures on completed integrated circuit wafers. The process, known as Single Crystal Reactive Etching And Metallization ("SCREAM I"), may be used to produce a variety of sensor devices such as accelerometers, as well as a variety of actuator devices, resonators, movable optical reflectors, and the like, either as separate, discrete devices on a substrate, or as components on previously-fabricated integrated circuits.

The SCREAM-I process is a dry bulk micromachining process which uses reactive ion etching to both define and release structures of arbitrary shape, and to provide defined metal surfaces on the released structure as well as on stationary interconnects, pads and the like. The earlier process defined in the above-mentioned copending application Ser. No. 07/821,944 also permitted fabrication of microstructures, but required two masks to define the structural elements and the metal contacts. The invention of Ser. No. 08/013,319 was developed from that earlier process, but improved on it by extending the structural depth to about 10 to 20 μm, permitting formation of beam elements 0.5 μm to 5 μm in width, eliminating the second mask/lithography step of the prior process, and allowing all structural elements, including movable elements such as beams and stationary elements such as interconnects, beams and contact pads, to be defined with a single mask so that the metal contacts applied to the structure are self-aligned.

The process relied, in general, on the formation of a dielectric mask on a single-crystal substrate such as silicon, gallium arsenide, silicon germanium, indium phosphide, compound and complex structures such as aluminum-gallium arsenide-gallium arsenide and other quantum well or multilayer super lattice semiconductor structures in which movable released structural elements electrically isolated from surrounding substrate materials and metallized for selective electrical connections could be fabricated using a single mask. The structure so fabricated could be discrete; i.e., fabricated in its own wafer, in which case any of the aforementioned substrate materials could be used, or it could be integrated in a silicon integrated circuit wafer, in which case the substrate material would be silicon, allowing low temperature processing in accordance with the invention.

Complex shapes can be fabricated in accordance with the invention described in Ser. No. 08/013,319, including triangular and rectangular structures, as well as curved structures such as circles, ellipses and parabolas for use in the fabrication of fixed and variable inductors, transformers, capacitors, switches, and the like. Released structures were fabricated for motion along X and Y axes in the plane of the substrate, along a Z axis perpendicular to the plane of the substrate, and for torsional motion out of the plane of the substrate.

In essence, the invention permitted fabrication of released structures and the subsequent metallization of such structures with a single dielectric mask by using theft mask to define deep isolating trenches completely around the structures, undercutting these structures to selectively release them and to produce cavities at the bases of surrounding mesas, and then metallizing the exposed surfaces. The undercutting and cavity formation broke the continuity of the deposited metal, thereby electrically isolating the metal on released structures and defined mesas from the metal on the bottom of the trenches, and a dielectric layer isolated the metal from the underlying substrate. The elements defined by the trenches were interconnected by the metal layer so that released structures could be electrically connected through the metal layer to pads in the surrounding mesas, with interconnects provided in selected locations and with the interconnects and pads also being defined by the trenches.

When the foregoing single mask process is carried out on a substrate or wafer integrally with existing circuitry, the low temperature process is preferred to prevent damage to the existing circuitry. The process of the copending application Ser. No. 08/013,319 forms deep, narrow trenches to define the isolated and released structures and thereby to produce high aspect ratio structures which can be metallized on their side walls for high capacitance between adjacent walls. In addition, the process permits a deep etching below the released structures to reduce parasitic capacitance between the released structures and metal on the trench floor. The etching process also produces extended cavities in the side walls of the mesas surrounding the released structures so as to reduce leakage current between metal on the side walls and on the trench floor. The metallization on the released structures cooperates with metallization on mesa side walls and metallization on the trench floors to capacitively control and/or sense horizontal and vertical motion of the released structure.

If desired, it is also possible to carry out additional steps after completion of the single mask processing described above to modify the resulting structure. For example, an additional masking step can permit variation of the spring constant of a released beam. In addition, a membrane can be added to released structures to increase their weight for use in accelerometers, and these membranes can be polished for use as movable mirrors. Additional steps may be used to connect metal layers to external circuitry, as by way of vias, and plural layers can be fabricated to form superimposed structures.

A wide range of devices can be fabricated utilizing the process of the invention described in Ser. No. 08/013,319. As noted above, the process is independent of crystal structure in the substrate, so that essentially any shape can be fabricated and released. Thus, single or multiple fingers cantilevered to a side wall of a substrate and extending outwardly over a trench bottom wall, and various grids and arrays can be fabricated and various electrical components can be formed. These various structures may be referred to as "beams" or "released beams", it being understood that such beams or released beams can be of any desired shape and can be single or multiple structures.

The metallization of selected walls and surfaces of the beams and surrounding substrate allows capacitive control and sensing of horizontal motion in the released structures, while metallization of the trench bottom wall allows control and sensing of vertical motion. By providing a relatively wide released structure, for example in the form of a grid or plate,, supported axially by single beams to a surrounding mesa wall, and by selectively applying a potential between one side or the other of the plate and the metal on the trench bottom, selective torsional rotation of the plate about the axis of its supporting arms can be produced. Such a torsional rotation of a plate has numerous applications; for example, in optics.

The released structures can be in the form of, for example, a single beam which serves as an accelerometer or a sensor and which is movable horizontally and vertically or in the form of plural beams in side by side parallel arrangement, or in various other arrays. Plural beam structures can work together, for example moving horizontally toward and away from each other to form "tweezers", or can have varying characteristics, such as thickness, to provide varying responses and thus to provide a wide range of motion or sensitivity in, for example, an accelerometer. Furthermore, various grid-like arrays may be provided to add mass or to provide torsional motion as described above.

The basic single mask process described in Ser. No. 08/013,319 can be outlined as follows.

First, a dielectric layer of oxide or nitride is deposited on a wafer or substrate, this layer serving as the single mask throughout the remainder of the steps. A standard PECVD process is used because of its high deposition rate and low deposition temperature. Thereafter, resist is spun, exposed and developed on the mask layer. Standard photolithographic resist techniques are used to define the desired beams, pads, interconnects and like structures. Thereafter, the pattern produced in the resist is transferred from the resist to the mask dielectric using, for example, $CHF_3$ magnetron ion etching (MIE) or RIE.

An $O_2$ plasma etch may be used to strip the resist layer, and the patterned dielectric mask is then used to transfer the pattern into the underlying wafer to form trenches around the desired structures. A deep vertical reactive ion etch (RIE) or chemically assisted ion beam etch (CAIBE) is required for this purpose. Depending on the choice of structure height, the trenches may be from 4 to 20 μm deep, with substantially vertical, smooth walls.

After completion of the trenches, a protective conformal layer of PECVD oxide or nitride is applied to cover the silicon beams/structures to a thickness of about 0.3 μm thick. The conformal dielectric layer covers the top surfaces of the surrounding substrate (or mesa), the defined structures, and the sides and the bottom wall of the trench, so it is necessary to remove the dielectric from the trench bottom wall, as by an anisotropic $CF_4/O_2$ RIE at 10 mT. This etch does not require a mask, but removes 0.3 μm of dielectric from the beam and mesa top surfaces and from the trench bottom, leaving the side wall coating undisturbed. As a result, the beam is left with a top surface layer and a side wall layer of dielectric, with the bottom of the trench being film-free.

A deep RIE or CAIBE is then used to etch the trench floor down below the lower edge of the sidewall dielectric. This etch preferably exposes 3 to 5 μm of substrate underneath the dielectric on each side of the beams and under the dielectric on the walls of the surrounding mesa, and it is this exposed substrate under the beams and on the mesa walls which is to be removed during the release step. The release is carried out by an isotropic RIE which etches the substrate out from under the beams or other structures, thus releasing them, and etching the substrate on the mesa walls to form cavities. The etch has high selectivity to the dielectric, allowing several microns of substrate to be etched without appreciably affecting the protective dielectric coating. After release, the beams are held cantilevered over the bottom wall of the deep silicon trench by their connections to the surrounding mesa at their ends, for example.

Each released, cantilevered structure has a core of semiconductor material such as single crystal silicon and a conformal coating of dielectric surrounding it on the top surface and side walls. The structural beams may be cantilevered at the ends and free-floating in the center, for example. To activate the structure, either by measuring its motion or by driving it into motion, a metal layer is required. Accordingly, as a final step, an aluminum layer is sputter deposited onto the beam top surface and side walls of the beam, onto the floor of the trenches, and onto the top surface and side walls of the surrounding mesa. The structure is now complete and simply needs to be connected to suitable circuitry to activate it. The circuitry may be on a separate substrate or may be formed in the wafer adjacent the location of the beam prior to fabrication of the beam. It may also be desirable, depending on the application, to add a thin passivation oxide layer 100 to 200 nm thick to prevent shorting between moving structures.

Although the foregoing single mask process has numerous advantages in low temperature applications, and permits fabrication of a wide variety of microelectromechanical structures, there is a need for making single crystal silicon released microstructures which can be electrically isolated from each other while remaining mechanically interconnected. Such structures can be difficult to make using the process described above.

SUMMARY OF THE INVENTION

It is, therefore, an object of the invention to provide a modified process for fabricating microelectromechanical structures (MEMS) from single crystal silicon.

It is another object of the invention to provide an improved process for fabricating single crystal silicon MEMS having electrically isolating segments.

Briefly, the present invention is directed to a method of fabricating released microelectromechanical and microoptomechanical structures from single crystal silicon, wherein the structures incorporate electrically isolating segments. The method of the invention is similar to the SCREAM I process described in Ser. No. 08/013,319, differing at two of the prior steps to change the process sufficiently to enable preparation of electrically isolating segments in microstructures of various shapes. As a result of these changes, the process is no longer a low temperature, single mask process, but it builds on the prior procedure to provide an important variation in the microstructures available in single crystal silicon.

The present invention is a high temperature isolation process using thermal oxidation to isolate and to define MEM devices, using a method similar to that of the aforesaid '319 application. The process follows the 11-step process of the prior application, but substitutes for Step 6 a thermal oxidation step followed by a second masking step and a second thermal oxidation. The thermal oxidation step is carried out on the side walls of single crystal structures such as beams, and into the floors of trenches formed in the substrate, with the oxide growing into these structures instead of merely coating them. In accordance with the process, some segments of the beams are purposely made thinner than others, for example by 0.5 to 1.0 μm. The silicon of the beam structure is partially consumed by the oxidation process, and since a constant thickness is consumed on all exposed surfaces, regardless of orientation, the thinner beam segments will be almost entirely consumed, while the thicker segments will retain a greater amount of silicon inside the thermally grown oxide layer.

Thereafter, according to the invention,, a second photolithographic mask step is used to remove the sidewall oxide from the beams in the thin regions to expose the silicon, while leaving the sidewall oxide in place on the thick regions. This is followed by a second thermal oxidation step so the now-exposed silicon regions will be completely oxidized, providing an electrically insulating isolation segment of oxide connecting adjacent silicon beam segments, connecting a beam to a trench wall, or providing any desired isolation.

The SCREAM-I process is then resumed, and the beam segments, including the isolating segment, are released from the underlying substrate. The thick beam segments have top and side oxide layers on a silicon core, while the thin segments are solid oxide. The solide oxide segments can be used to hold the thicker silicon beams in place, thus isolating the thick beam segments and their silicon cores from the substrate. The thick beams effectively form conductive plates which may be 10–20 μm tall and several hundred micrometers long, with a high aspect ratio and surrounded by a high quality insulating dielectric. These plates can serve as capacitors and can sense relative motion between adjacent segments, so they can serve as sensors and actuators in the manner described for the structures produced by the SCREAM I process.

By further varying the metalization step of the SCREAM I process, evaporated metal can be used to connect selected segments together or to corresponding pads or connectors on adjacent substrate surfaces.

Although the high temperature thermal oxidation step is not compatible with some preformed microstructures, the process of the invention permits fabrication of a highly useful modification of the structures previously constructed, using a process that is similar to, and thus compatible with, the SCREAM I process.

BRIEF DESCRIPTION OF THE DRAWINGS

Although the foregoing and additional objects, features and advantages of the present invention will become apparent to those of skill in the art from the following more detailed description of a preferred embodiment, taken in conjunction with the accompanying drawings, in which:

FIGS. 1A–1J illustrate Steps 1 through 10, respectively, of a single-mask process for fabricating microelectromechanical structures;

DETAILED DESCRIPTION OF THE INVENTION

Figure 1I:
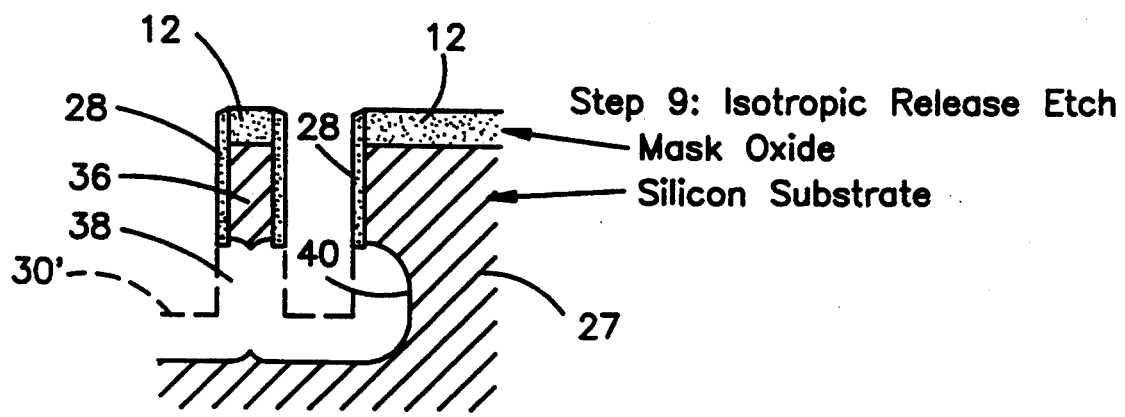

The basic SCREAM I process is capable of fabricating a functioning MEM structure with a single mask. The basic process and its variations all rely on the characteristics of single-crystal structures for the substrates, and further depend on the use of standard fabrication tools, on the use of optical or E-beam lithography and on self-aligned construction. The process permits definition of high-aspect-ratio structures such as beams having walls closely spaced to corresponding sidewalls on a substrate for high capacitance between adjacent opposed walls. The basic process is illustrated in Steps 1 through 10 of FIGS. 1A through 1J, respectively, of the drawings, which outline the single-mask, low-temperature, self-aligned process for making microelectromechanical structures described in U.S. Ser. No. 08/013,319. These figures illustrate the fabrication of a released, cantilevered beam which is free to move left or right in a generally horizontal path (as viewed in the figures), and illustrate an adjacent vertical static plate which forms a parallel capacitor plate to measure the motion of the beam or, in the alternative, to cause motion of the beam.

The illustrated process is implemented with a single mask, with the structure being fabricated as a discrete element on a wafer or die. As previously noted, a discrete element is defined as an element on a wafer without electronic circuitry but which has bonding/contact pads that will be wire-bonded to external circuitry. In other embodiments of the invention, discussed in the aforesaid '319 application, the structure is fabricated as an integrated circuit chip and directly connected to on-chip circuitry through interconnects or vias.

The following Table I outlines the single-mask process, which is described more fully hereinbelow.

TABLE I

| | |
|---|---|
| 1. Mask dielectric | PECVD (1–2 μm) oxide or nitride |
| 2. Photolithography | Vapor prime |
| | Spin & bake resist |
| | Expose |
| | Develop |
| | Descum |
| 3. Pattern transfer | CHF₃ MIE |
| 4. Resist removal | O₂ plasma |
| 5. Trench etch #1 | Cl₂ RIE |
| 6. Sidewall dielectric | PECVD (0.3 μm) oxide or nitride |
| 7. Clear floor dielectric | CF₄ RIE |
| 8. Trench Etch #2 | Cl₂ RIE |
| 9. Release | SF₆ RIE |
| 10. Sputter metal | Aluminum or equivalent metal |
| 11. Wire bond | |

Steps 1 through 10 of the Table correspond to Steps 1 through 10 of FIG. 1.

Referring now to FIG. 1A, in Step 1 of the process, a clean, open area of bare silicon such as a top surface 8 of a single crystal silicon wafer 10 is provided, on which is deposited a layer 12 of oxide (SiO₂), this layer serving as a mask throughout the remainder of the steps. Although this oxide may be grown in a furnace, this would be suitable only for discrete elements, for the formation of a thermal oxide requires temperatures of 1000° or more, which would damage any electrical elements on the wafer. The oxide layer 12 can be deposited by PECVD or by some combination of PECVD and thermal growth, but a standard PECVD process is preferred because of its high deposition rate and the fact that it has a low deposition temperature in the range of 300°500° which is suitable for fabrication of integral elements on wafers carrying electrical components. The minimum oxide thickness is determined by how fast the later RIE steps (to be described) will etch the oxide, but in general, the oxide mask layer can be a great deal thicker than the required minimum thickness. In a typical process where the beam or other structure height is to be 10 $\mu$m, a thickness of about 0.7 $\mu$m is desirable for the oxide.

The height of the structure to be fabricated is, more precisely, the height of a silicon "skeleton" which will be located inside the oxide-coated released beams fabricated by the present process. This silicon skeleton is the major component of the beams produced by the process and, as noted above, typically can have a height of about 10–20 $\mu$m, with a minimum height of about 3 $\mu$m.

Step 2, illustrated in FIG. 1B, is a photolithography step wherein a resist material 14 is spun onto the top surface 16 of the mask oxide, is exposed, and is developed, using standard optical photolithographic resist techniques to produce a pattern 18. Optical techniques are preferred, since a resolution of less than about 0.5 $\mu$m generally is not required; however, if better resolution is needed, electron beam lithography with a tri-level resist and an aluminum lift-off mask can be used.

Using the pattern 18 developed in the resist, the underlying oxide layer 12 is etched to transfer the pattern to the oxide mask, as illustrated in FIG. 1C, Step 3. As there illustrated, the oxide layer 12 is etched using, for example, CHF$_3$ in a magnetron-ion etching (MIE) machine. Such etching is virtually identical to RIE, except it utilizes a large magnet which concentrates the plasma and increases the etch rate. The high etch rate of MIE helps to prevent resist burning. In addition, the MIE etches at a very low pressure (about 1 to 3 mTorr), provides vertical side walls and increases throughput. The pattern 18 formed in the resist material 14 is thus transferred to the mask oxide 12, as illustrated by mask pattern 20.

The resist material is not used to mask the pattern 18 directly onto the silicon substrate 10 because the Cl$_2$ etch (to be described), which is used to dig the trenches in the silicon to form the beam structures, etches resist material much more quickly than oxide. Thus, the use of an oxide mask allows the silicon etch to last longer and to dig deeper than could be done with the same thickness of resist.

Following the pattern transfer of Step 3, the resist material is stripped, as illustrated in Step 4, FIG. 1D. The resist is removed in known manner as, for example, by an O$_2$ plasma etch utilizing a "barrel asher", wherein ionized oxygen radicals attack the resist, or by utilizing a wet chemical resist strip using a chemical solvent that dissolves the resist. The O$_2$ plasma etch is preferred since it is fast, removes the resist completely to leave a clean surface, and has a high throughput.

A deep silicon etch is illustrated in Step 5 (FIG. 1E), in which the pattern 20 is transferred into the silicon 10 by a deep, vertical anisotropic BCl$_3$/Cl$_2$ RIE to form deep trenches 22. The etch is carried out in three steps in a standard RIE chamber, as illustrated in the following Table II.

TABLE II

| Parameter | Step 1 | Step 2 | Step 3 |
|---|---|---|---|
| Power: | 200 Volts | 300 Volts | 475 Volts |
| Pressure: | 20 mTorr | 20 mTorr | 40 mTorr |
| Time: | 1 min. | 1 min. | (user defined) |
| Chemistry: | | | |
| Cl$_2$ | 0 sccm | 2 sccm | 50 sccm |
| BCl$_3$ | 4 sccm | 14 sccm | 5 sccm |
| H$_2$ | 7 sccm | 7 sccm | 0 sccm |
| Etch Rate: Si | 1900 Å/min. = 11.4 $\mu$m/hr | | |
| Etch Rate: SiO$_2$ | 96 Å/min. = 0.576 $\mu$m/hr | | |
| Selectivity: | 20:1:Silicon:Oxide | | |

Because of the very high selectivity in the main Cl$_2$ etch, in the range of 20 to 1 for silicon and silicon oxide, the presence of a native oxide can cause unwanted masking. Therefore, the first two etch steps are used to attack and remove the first 10 to 20 nm of oxide, while the third step is used to carve out the silicon trench. The BCl$_3$ gas etches oxide, while the Cl$_2$ etches silicon. A better selectivity in the etch could be obtained by eliminating the BCl$_3$ and using pure Cl$_2$ so that 40 $\mu$m of silicon would be etched for every 1 $\mu$m of oxide. However, any small pieces of oxide that might fall into the trench would act as an undesired mask because of this selectivity. This commonly happens during etching, with sputtered pieces of oxide falling into the trench and acting as minute masks. The BCl$_3$ etches the oxide that falls into the trench and thus improves the quality of etch.

The Cl$_2$/BCl$_3$ etch has an additional effect which is very helpful; namely, in situ side wall thin film deposition. This etch deposits a thin layer 24 of silicon dioxide on the side wall and bottom of the trenches during the etch, and this thin layer acts as an additional side wall mask which can be used in subsequent steps.

At this point in the process, as illustrated in FIG. 1E, deep trenches 22 have been carved into the substrate 10, following the pattern 20 of the mask oxide 12. A cross-section of the substrate, such as that shown in FIG. 1E, reveals one or more silicon islands 26 (only one of which is illustrated) surrounded by trenches which separate the islands from the surrounding substrate which forms a mesa 27. The islands can be any selected width, for example about one micron, can be several microns tall, can be hundreds of microns long, and can be in any desired shape or pattern, as established by the photolithograph step. The islands 26 and the surrounding substrate 27 may both be referred to as mesas, and each has an oxide mask 12 on the mesa top and a thin oxide layer 24 on the side walls caused by the Cl$_2$ etch. The core of the island 26 is single crystal silicon, as is the substrate 10 which forms mesa 27.

In order to release the island structures, a protective film is provided on the top surface and on the side walls, with the trench bottom being bare silicon so that an isotropic RIE cart be used to etch the silicon out from under the islands to form cantilevered or free standing beams, and to etch the silicon out from under the surrounding mesa to form undercut cavities.

More particularly, a protective film for the silicon islands and surrounding mesa is provided in accordance with Step 6, illustrated in FIG. 1F, wherein the entire wafer is coated with a protective oxide layer 28, using a standard plasma enhanced chemical vapor deposition (PECVD) process. This is very similar to an RIE, except that the gases which flow into the chamber react to form films, rather than attack them. SiH$_4$ and NO$_2$ react to form silicon dioxide and NH₃, with the individual molecules of silicon dioxide bonding to the surface of the wafer and forming a thin film of oxide. The reaction is very conformal; that is, it covers all surfaces with an equally thick layer, regardless of angle or orientation. The layer of oxide 28 illustrated in FIG. 1F incorporates the thin layer 24 illustrated in FIG. 1E. In accordance with this process, the layer 28 extends over the mask layer 12 so that the thickness of the silicon dioxide on the island and mesa tops is thicker than that at the floor 30 of the trenches 22.

As illustrated in FIG. 1G, in Step 7 of the process the oxide layer 28 on the floor 30 of the trenches is removed by an anisotropic $CF_4/O_2$ RIE. This etch carves straight down, with very little lateral influence and is easily done with a low pressure RIE. This effectively removes one layer from every horizontal surface; in this case, the island and mesa top surfaces and the trench bottom, and does not affect the side walls, thereby leaving an oxide layer that covers the top and sides of the island 26 and surrounding mesa 27, but leaves the floor 30 open, as illustrated in FIG. 1G.

With the trench floor 30 film-free, a second anisotropic $Cl_2/BCl_3$ RIE silicon etch is carried out, as illustrated at Step 8 in FIG. 1H. At this point, the mask and side wall oxides 12 and 28 are in place on the mesas 26 and 27 and only the trench floor is film-free silicon. This second silicon etch adds about 3 to 5 $\mu m$ of depth to the trench bottom 30; that is, the trench bottom is etched 3 to 5 $\mu m$ below the lower edge 32 of the side wall oxide layer 28, thereby exposing 3 to 5 $\mu m$ of side wall silicon 34. This etch, which facilitates the next following isotropic release etch (Step 9) by exposing the silicon at the bases of the islands 26, has three benefits; it facilitates the release of the structures, it lowers the trench floor to control the spacing between the beam, when it is released, and the floor, and it prevents excessive upward etching of the structure behind the side wall oxide coating 28.

Step 9, FIG. 1I, illustrates the isotropic release etch step which separates and releases the islands from the underlying substrate to produce released beams such as the beam 36, which may, for example, be connected at one end to extend in a cantilevered fashion over the floor of the trench. This etch step is an $SF_6$ isotropic high pressure, low power RIE process which attacks the silicon at the trench floor 30 and the lower side wall portion 34 to etch the silicon from under the mesas in the region 38 indicated by the dotted lines. The island 36 is narrow in the region of the etch so it is fully released. The $SF_6$ etch also etches out a cavity 40 in the side wall of the substrate mesa 27, adjacent the location of the beam 36, the upper portion of the mesa side wall being protected by the oxide layers 12 and 28, discussed above, creating a new trench floor 30'.

It is noted that although the second silicon etch of Step 8 is preferred, it is not essential because the $SF_6$ release etch of Step 9 can etch downwardly through the floor 30 of the trench and eventually will etch away under the mesas. However, this takes an additional amount of etching time because the $SF_6$ etchant reaction is "transport limited"; that is, the etchant can't reach the surfaces to be etched fast enough in the narrow trenches. In contrast, the $SF_6$ etch will be more efficient if Step No. 8 is included, for in that case a large, open silicon side wall is presented which allows lateral etching to begin immediately to minimize the required $SF_6$ release time.

By including Step No. 8, the vertical distance between the released beams 36 and the trench bottom 30 (FIG. 1I) can be controlled. If Step No. 8 is excluded, the beam to floor distance will depend only on the $SF_6$ release time, but by adding a silicon etch before the release this distance can be increased as required.

It has been found that as the $SF_6$ etchant begins to etch underneath the mesas 24, it begins to reach up underneath the beams, within the protective layers 28, since the etchant etches in all directions equally. Normally, a plasma etch is directed toward to the surface to be etched with an accelerating potential which drives the etchant down to the substrate, so an RIE normally is an inherently directional etch. However, isotropic etching can be obtained by increasing the pressure so that the directionality is less evident and lateral etching is more evident, and the present invention preferably utilizes a sufficiently high pressure to make the release more isotropic than directional and to rapidly undercut the island.

If the deepening of Step 8 is not used, the initial distance from the undersurface of beam 36 to floor 30 will be from 3–5 $\mu m$. However, if the etch of Step 8 is used, this distance increases to between 5 and 9 $\mu m$ from beam 36 to floor 30' by the end of the etch. The increase in the distance between the beam and the floor of the trench during the etching process also limits the upward etch rate under the protective oxide layers 28, thus ensuring a high aspect ratio for the released beam 36.

Figure 1J:
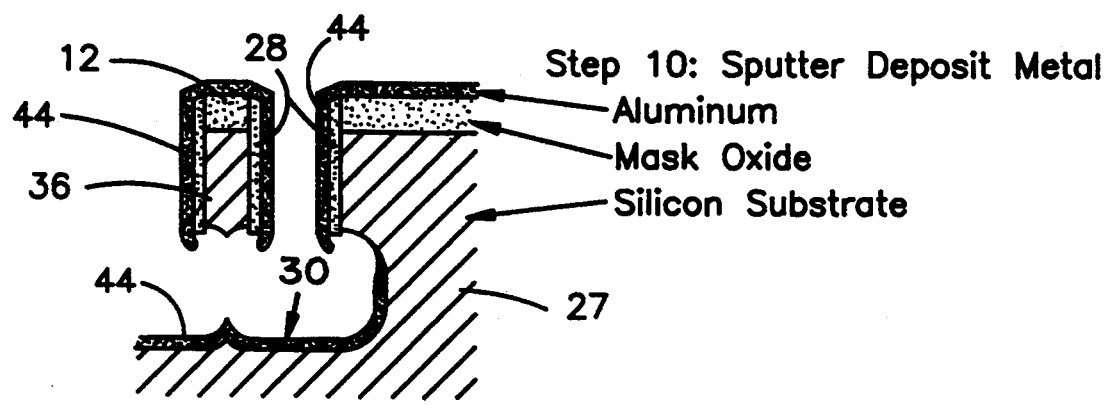

As illustrated in Step 10, FIG. 1J, a sputter deposition of aluminum can be used to provide metallization of the beam top surface and side walls, as well as the surface and side walls of mesa 27. Such a metal layer is illustrated at 44 in FIG. 1J, with the spacing between the beam and the floor 30 and the cavity 40 providing isolating breaks in the coating. The metallization on the top surfaces and side walls of the mesas is thus isolated from that on the floor 30 of the trenches, thereby producing a complete, electrically isolated metallized structure such as the beam 36 which can then be interconnected to suitable circuitry. It is noted that the metal layer 44 is also electrically isolated from the underlying silicon by oxide layers 12 and 28.

The modified SCREAM I process of the present invention is a high temperature isolation (HTI) process that uses thermal oxidation to define MEM devices. The process is largely the same as the SCREAM I method of Table I, but has differences which allow isolating segments to be provided in the MEM device while retaining many of the benefits of the SCREAM I process. The HTI process is outlined in Table II and illustrated in corresponding FIGS. 1A-1:

TABLE III

| Step Number | Description |
| --- | --- |
| 1. PECVD Oxide | Deposit/Grow mask oxide |
| 2. Photolithography #1 | Pattern structure layer |
| 3. Anisotropic CHF₃MIE | Pattern Transfer |
| 4. O₂ Plasma Strip | Resist Removal |
| 5. Cl₂ RIE of Silicon #1 | Deep silicon trench etch #1 (10 $\mu m$ typ. |
| 6. Wet Thermal Oxidation #1 | Deep furnace oxidation #1 (6000Å typ.) |
| 7. Photolithography #2 | Pattern thin beams for oxide strip (thick resist) |
| 8. BHF Oxide etch | Strip oxide from thin beams |
| 9. Wet chemical resist strip & O₂ plasma | Strip residual resist |
| 10. Wet thermal oxidation #2 | Deep furnace oxidation #2 (6000Å typ.) |
| 11. Anisotropic CF₄RIE | Clear floor oxide |

TABLE III-continued

| Step Number | Description |
| --- | --- |
| 12. Cl$_2$RIE of Silicon #2 | Deep silicon trench etch #2 (4 μm typ.) |
| 13. Isotropic SF$_6$RIE | Release structure |
| 14. Photolithography #3 | Pattern vias for metallization (thick resist) |
| 15. Anisotropic CHF$_3$RIE | Etch vias into oxide on top of beams |
| 16. Wet chemical resist strip & O$_2$ plasma | Strip residual resist |
| 17. H$_2$ furnace anneal | Sinter exposed silicon for aluminum (optional) |
| 18. Evaporate aluminum | Deposit top level metal |
| 19. Photolithography #4 | Pattern metal (thick resist) |
| 20. Isotropic Cl$_2$RIE | Etch aluminum metallization |
| 21. Wet chemical resist strip & O$_2$ plasma | Strip residual resist |

Figure 2:
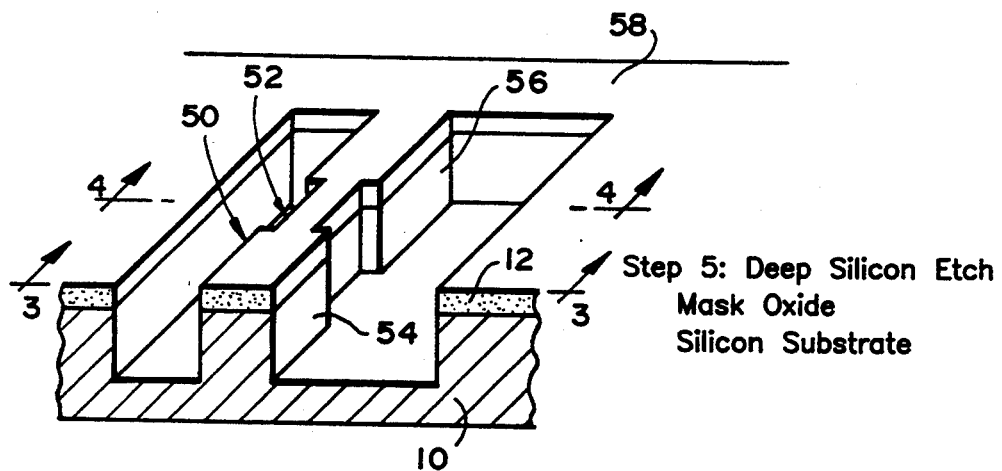
FIG. 2 is a diagrammatic perspective view of a beam structure fabricated in accordance with Steps 1–5 of the SCREAM I process, and following a pattern incorporating a narrow region in accordance with the present invention.

The HTI process of the present invention is identical to the SCREAM I process for Steps 1–5, as described above. However, the substrate is prepared for the process of the present invention in the photolithographic Step 2, where the structure is patterned. FIG. 2 illustrates at 50 a beam which, for purposes of providing an isolating region, is patterned to have a narrow region 52 at a selected location along its length. This region preferably is 0.5 μm to 1.0 μm thinner than adjacent regions 54 and 56, and may be positioned anywhere within the structure. The thin region is used, in accordance with the process to be described below, to provide an oxidized isolating region which electrically separates adjacent single crystal silicon segments 54 and 56 of the beam. It will be understood that an oxidized isolating region can be used to separate the conductive portion of the beam from the surrounding substrate 58 or may be interposed at several locations along a single beam to provide separated segments, or may be at any other desired location an electrical insulator is desired.

After the pattern has been transferred and the resist removed, the deep silicon trench edge of Step 5 (illustrated in FIG. 1E above) produces the structure illustrated in FIG. 2.

Figure 3A:
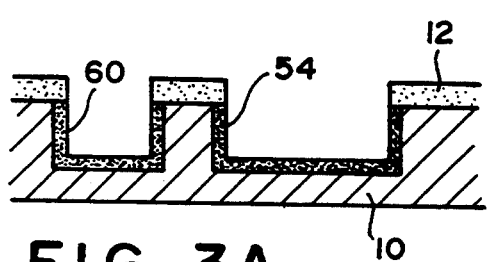
FIGS. 3A–3D illustrate the process of the present invention at a cross-section taken at lines 3—3 of FIG. 2.
Figure 4A:
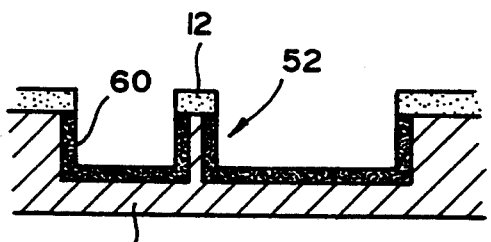
FIGS. 4A–4D illustrate the process of the present invention at a cross-section taken at lines 4—4 of FIG. 2.

In accordance with the invention, Step 6 is a wet thermal oxidation step carried out in an oxidizing furnace to produce a thermal oxide layer 60 such as that illustrated in FIGS. 3A and 4A. FIG. 3A is a cross sectional view of the patterned structure taken along lines 3—3 of FIG. 2, while FIG. 4A is a sectional view taken along line 4—4 of FIG. 2. As illustrated, the thermal oxide 60 is grown into the surface of the silicon material 10, consuming a portion of the silicon beam at both sections 52 and 54. This contrasts with the SCREAM process illustrated in FIG. 1F, where the oxide is deposited on the surface of the silicon. The thermal oxide of the present process will grow on bare silicon, but grows only slowly into existing oxides. Whereas the SCREAM oxide discussed above is deposited at a low temperature; for example, 240° C., in the relatively short period of about nine minutes, the thermal oxide of FIGS. 3A and 4A is grown at 1100° C. and may require as much as 60 minutes. As illustrated in FIGS. 3A and 4A, the thermal oxide grows into the side walls of the beam structure 50, as well as into the side walls of the surrounding substrate, and thus thins the beam structure. Since a constant thickness of silicon is consumed on all exposed surfaces, regardless of orientation, the thinner segment 52 of the beam 50 will be almost entirely consumed in this first thermal step, while the thicker beam segments 54 and 56 will have a significantly greater amount of silicon remaining after this step.

Figure 3B:
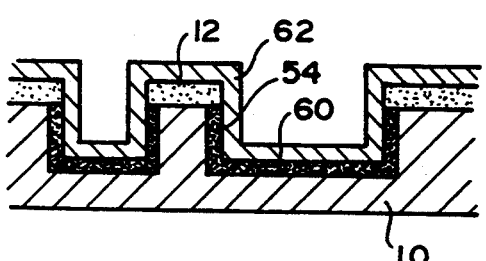
Figure 4B:
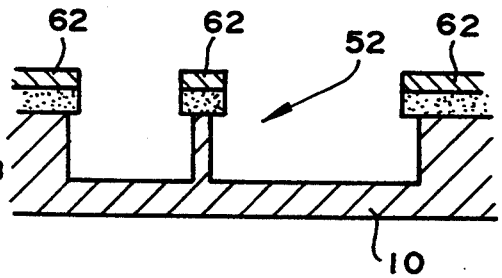

Because the thermal oxidation process is not linear with time, in contrast with the deposition process described with respect to FIG. 1F, there is a point of diminishing return for time spent in the furnace, and accordingly a second thermal oxide procedure is normally required in order to completely oxidize the narrow region 52. Accordingly, as illustrated in FIGS. 3B and 4B, following the first oxidation, a photolithographic step is used to again pattern the structure. A photoresist layer 62 is applied and patterned to cover selected regions, such as the thicker beam regions 54 and 56 and the surrounding substrate (FIG. 3B), the patterning step leaving the narrow region 52 without a resist material (FIG. 4B). Thereafter, in Step 8 (FIGS. 3B and 4B), a BHF oxide etching step is used to strip the oxide layer 60 from the structure where it has been exposed by the resist pattern, as illustrated in the narrow region of the beam at 52 (FIG. 4B).

Figure 3C:
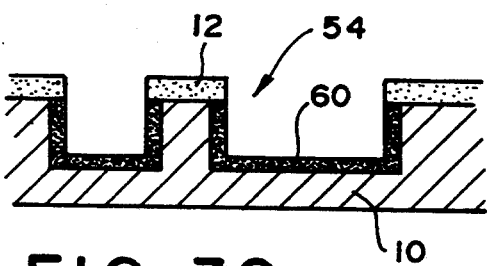
Figure 4C:
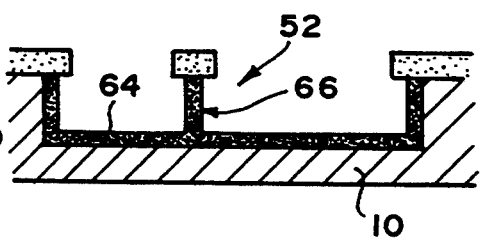

Thereafter, as described in Step 9 and illustrated at in FIGS. 3C and 4C, a wet chemical resist strip is used to remove the residual resist material 62 from the structure, and this is followed by a second deep furnace oxidation, described in Step 10 and also illustrated in FIGS. 3C and 4C. This second thermal oxidation thickens the existing layer 60 of oxide in the regions 54 and 56 and along the side walls of the substrate 10 a small amount, and provides a new thermal oxide 64 in the region 52, where bare silicon had been exposed in Step 8. This second thermal oxidation completely oxidizes the narrow beam region 52 to provide a completely oxidized isolating segment 66 in the narrow region 52, as illustrated in FIG. 4C.

Figure 3D:
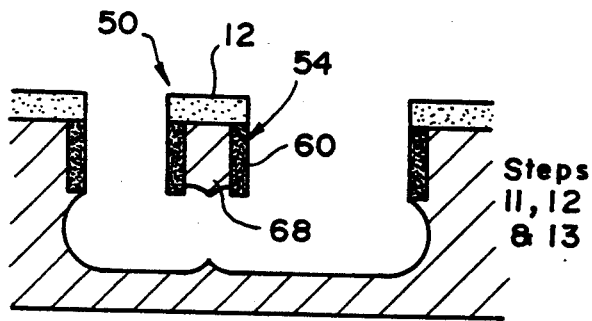
Figure 4D:
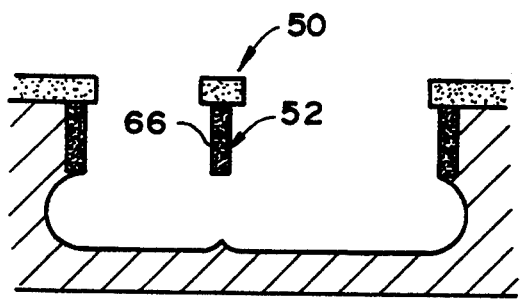

Thereafter, the prior SCREAM I process is resumed, with an isotropic SF$_4$ RIE process being used to clear the oxide on the floor of the trench surrounding the island, as illustrated in FIGS. 3D and 4D, and described at Step 11 of Table III. This step is the same as Step 9 of the SCREAM process described above. This is followed by a deep silicon trench etch, described at Step 12 of Table II, and by an isotropic SF$_6$RIE process which releases the beam structure, as described with respect to Step 13 and illustrated in FIGS. 3D and 4D. This release step is the same as Step 9 of Table I in the SCREAM process.

At this point, as illustrated in FIGS. 3D and 4D, the structure includes a released beam 50 which includes a thick region 54 having a core 68 of single crystal silicon with oxide layers 12 and 60 on its top and side surfaces, respectively. The beam also includes a thin region 52 wherein the silicon has been completely oxidized to form the isolating segment 66 which joins the adjacent sections 54 and 56 and also provides a mechanical supporting mechanism for the beam. Thick beam segments with core sections 68 can be used as capacitive plates, as discussed in the aforesaid Ser. No. 08/013,319, since the silicon section 68 is conductive and has a high aspect ratio, for example, 10 to 20 μm tall and 1–2 μm wide, and several hundred μm long, and surrounded by a high quality insulating dielectric (oxide).

Metallization of the beam segments and the surrounding substrate, as well as the formation of contacts and selected conductive regions is carried out by using a vertical oxide etch to open vias into the top of the thick beams and then by evaporating metal such as aluminum across the top of the beams, filling the vias and providing conductor lines. This process is described in Steps 14–21 of Table III, and is illustrated in FIGS. 5A and 5B, to which reference is now made.

Figure 5A:
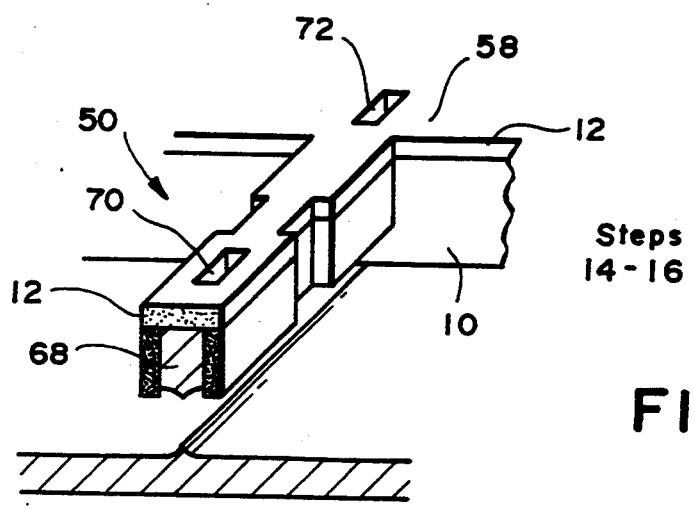
FIGS. 5A and 5B illustrate a metallization process for use with the isolated structure of the invention.
Figure 5B:
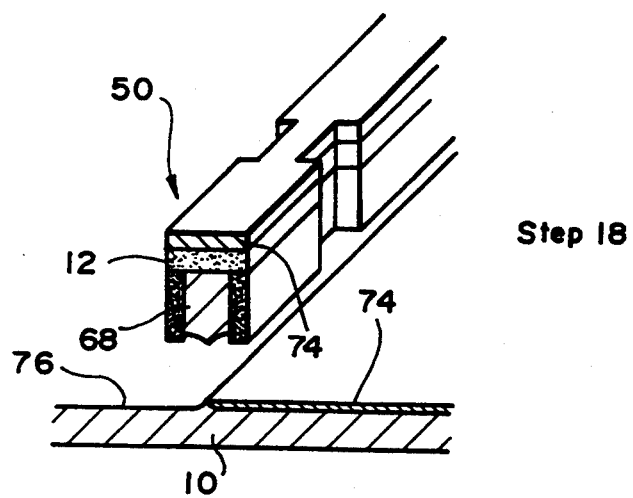

FIG. 5A illustrates the structure resulting from the process of Steps 14–16, wherein a photolithographic process is used to pattern a resist material on the beam 50 or on the surrounding substrate using a thick resist material (not shown). An isotropic CHF$_3$ RIE is used to etch vias such as those illustrated at 70 and 72 through the oxide layer 12 carried on the top surface of beam 50 or on the upper surface of the surrounding substrate 58. These vias extend through the oxide to the conductive top surface of the silicon 68 in beam 50 or a connector pad fabricated on the substrate, and thereafter the resist material is removed at Step 16.

In Step 17, which is optional, the exposed silicon is sintered in a furnace anneal step and thereafter a layer of 74 of aluminum is deposited on the top surfaces of the structure. As illustrated in FIG. 5B, the layer of aluminum fills and covers the vias 70 and 72 and coats the floor 76 of the substrate below the beam 50.

The final steps of the process described in Table III involve a photolithographic patterning of the aluminum layer 74 (Step 19) followed by an etching step (Step 20) and a stripping of the residual resist (Step 21) to provide the desired aluminum conductors on the top surface of the beam and other surrounding structures. The use of such aluminum conductors is described in detail in the aforesaid Ser. No. 08/013,319.

It will be apparent that the process described above in accordance with the present invention can be used in a wide variety of microelectromechanical and microoptomechanical structures where electrical isolation is required without loss of mechanical interconnection. Although the invention has been described in terms of a preferred form, it will be apparent that variations and modifications can be made without departing from the true spririt and scope thereof, as set forth in the following claims.

What is claimed is:

1. A reactive ion etching process for fabricating a high aspect ratio, submicron, released single crystal structure having an electrically isolating segment, comprising:

forming a first mask layer on a top surface of a single crystal silicon substrate;

patterning said first mask layer to produce a first mask defining a single crystal silicon structure of arbitrary shape to be formed in and surrounded by said substrate, said shape being independent of crystal orientation in said substrate and including at least a beam portion to be released, said patterning step including producing in said first mask a shape of an electrically isolating region for said structure of arbitrary shape;

reactive ion etching said substrate through the pattern defined by said first mask to produce corresponding deep trenches in said substrate surrounding the defined structure of arbitrary shape, said structure having a top surface covered by said first mask and having substantially vertical side walls;

initially thermally oxidizing said defined structure to produce a thermal oxide layer on said walls and on the bottom of said deep trenches, the thermal oxide layer extending at least partially through said single crystal silicon in said isolating region;

producing a second mask surrounding the isolating region;

stripping the thermal oxide from said side walls in the isolating region;

removing the second mask;

subsequently thermally oxidizing said defined structure to increase the thickness of said thermal oxide layer surrounding said isolating region and completely oxidizing the remaining silicon in said isolating region;

removing the thermal oxide layer from the floor of said trenches to expose said single crystal substrate; and releasing at least said beam portion from its underlying substrate by reactive ion etching said exposed single crystal substrate in said trenches.

2. The process of claim 1, wherein the releasing step includes isotropically etching said substrate.

3. The process of claim 1, further including reactive ion etching said exposed single crystal substrate at the bottom of said trenches to deepen trenches prior to said releasing step.

4. The process of claim 3, wherein the step of releasing said beam portion includes isotropically etching said substrate in a reactive ion etch.

5. The process of claim 4, further including the step of coating said defined structure and surrounding substrate with a metal layer by depositing metal at least on said top surface mask and on said side wall oxide of said defined structure and surrounding substrate, and on the bottom of said trench.

6. The process of claim 5, wherein the step of isotropically etching said substrate includes undercutting said surrounding substrate to prevent continuous deposition of metal between said sidewalls and the bottom of said trenches.

7. The process of claim 1, wherein the step of producing the shape of an electrically isolating region in said first mask includes providing a mask shape which defines a structural shape of reduced cross-sectional dimensions at least in a beam portion of the structure.

8. The process of claim 7, wherein the step of initially thermally oxidizing said defined structure produces an oxide layer extending through a substantial portion of said isolating region.

9. The process of claim 1, wherein the step of forming said first mask layer includes depositing a dielectric material on said top surface.

10. The process of claim 1, wherein the step of forming said first mask layer includes depositing a dielectric oxide material.

11. A reactive ion etching process for fabricating a submicron released single crystal structure having an electrically isolating segment, comprising:

producing in a first mask layer on a single crystal substrate a pattern for a structure to be released, the pattern defining an electrically isolating region for the structure;

producing deep trenches in said substrate through said mask layer, the trenches surrounding and defining the structure to be released;

thermally oxidizing said defined structure to be released to completely oxidize said electrically isolating region while only partially oxidizing the remainder of said defined structure; and releasing said defined structure and oxidized electrically isolating region.

* * * * *